United States Patent
Kuo et al.

(10) Patent No.: US 6,744,119 B2
(45) Date of Patent: Jun. 1, 2004

(54) LEADFRAME HAVING SLOTS IN A DIE PAD

(75) Inventors: Frank Kuo, Kaohsiung (TW); Sen Mao, Kaohsiung (TW); Sam Kuo, Ping-Tung (TW); Oscar Ou, Kaohsiung (TW)

(73) Assignee: Siliconix (Taiwan) Ltd., Kaohsiung (TW)

( * ) Notice: Subject to any disclaimer, the term of this patent is extended or adjusted under 35 U.S.C. 154(b) by 0 days.

(21) Appl. No.: 09/978,603

(22) Filed: Oct. 15, 2001

(65) Prior Publication Data

US 2002/0056894 A1 May 16, 2002

(30) Foreign Application Priority Data

Oct. 16, 2000 (TW) .................... 89217870 U

(51) Int. Cl.⁷ .................. H01L 23/495; H01L 23/22; H01L 23/24; H01L 23/04; H01L 23/12; H01L 23/48; H01L 23/52; H01L 29/40

(52) U.S. Cl. ............ 257/667; 257/666; 257/668; 257/669; 257/676; 257/687; 257/711; 257/730; 257/778; 257/779; 257/782; 257/783

(58) Field of Search ................... 257/666, 667, 257/668, 669, 676, 687, 711, 730, 778, 779, 782, 783, 680, 774, 670, 671, 672, 773, 772

(56) References Cited

U.S. PATENT DOCUMENTS

| | | | | |
|---|---|---|---|---|
| 5,844,306 A | * | 12/1998 | Fujita et al. ................. | 257/676 |
| 5,847,446 A | * | 12/1998 | Park et al. ................... | 257/676 |
| 5,986,333 A | * | 11/1999 | Nakamura ................... | 257/667 |
| 6,081,029 A | * | 6/2000 | Yamaguchi .................. | 257/718 |
| 6,339,252 B1 | * | 1/2002 | Niones et al. .............. | 257/666 |
| 6,348,729 B1 | * | 2/2002 | Li et al. ..................... | 257/666 |

* cited by examiner

Primary Examiner—Nathan J. Flynn
Assistant Examiner—Victor A. Mandala, Jr.

(57) ABSTRACT

A die pad (81) of a leadframe (8) has a plurality of slots (811–814) that extend through the die pad to define a restrictive region (815). One of the slots extends around a corner of the restrictive region outside where a die (7) is connected to the die pad by solder paste (6). Because of the cohesion of the solder paste, the solder paste does not flow into the slots. The solder paste is thereby restricted to the restrictive region. This prevents the die from drifting or rotating so as to increase the packaging quality.

20 Claims, 6 Drawing Sheets

8

LEADFRAME HAVING SLOTS IN A DIE PAD

BACKGROUND OF THE INVENTION

1. Field of the Invention

The present invention relates to a leadframe for packaging a semiconductor device and, more particularly, to a leadframe having slots in a die pad.

2. Description of the Related Art

As shown in FIG. 1, a conventional leadframe 1 comprises a die pad 11 and a plurality of pins 12, 13. The die pad 11 is used for receiving a die. In a conventional packaging technique for a power transistor, for the purpose of dissipating heat from the power transistor, the area of the die pad 11 is usually made larger than that of the die.

Referring to FIG. 2, the die pad 11 receives a die 2, and the die 2 is connected to the die pad 11 with die-attach material 3 commonly consisting of tin solder paste or silver epoxy. When the die-attach material 3 is solder paste, the solder paste 3 must be heated during the packaging process. In the heating process, the solder paste 3 expands on the die pad such that the die 2 on the solder paste 3 drifts or rotates due to the movement of the melted solder paste 3. Therefore, the die 2 cannot be positioned precisely on the die pad 11. This lowers the quality of packaging the semiconductor device.

Therefore, it is desirable to provide a creative and improved die pad of a leadframe to overcome the above problem.

SUMMARY OF THE INVENTION

One objective of the present invention is to provide a die pad of a leadframe. The die pad is used for receiving a die. The die and the die pad are connected together by solder paste. The die pad has a plurality of slots that penetrate through the die pad. A restrictive region is formed between the slots such that the solder paste is restricted to the restrictive region. The die can be positioned on the restrictive region. Because of the cohesion of the solder paste, the solder paste does not flow into the slots. Therefore, the solder paste does not flow and expand everywhere during the heating process. The solder paste is restricted to the restrictive region so that the die on the solder paste does not shift or rotate, thereby increasing the packaging quality.

DETAILED DESCRIPTION OF THE INVENTION

Figure 1:
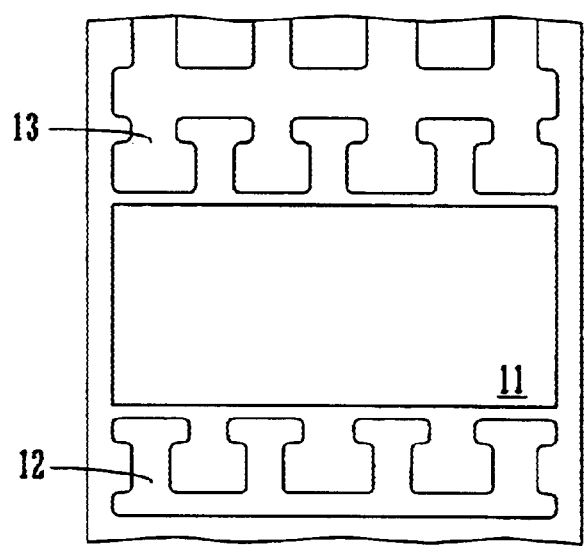
FIG. 1 shows a conventional leadframe.
Figure 2:
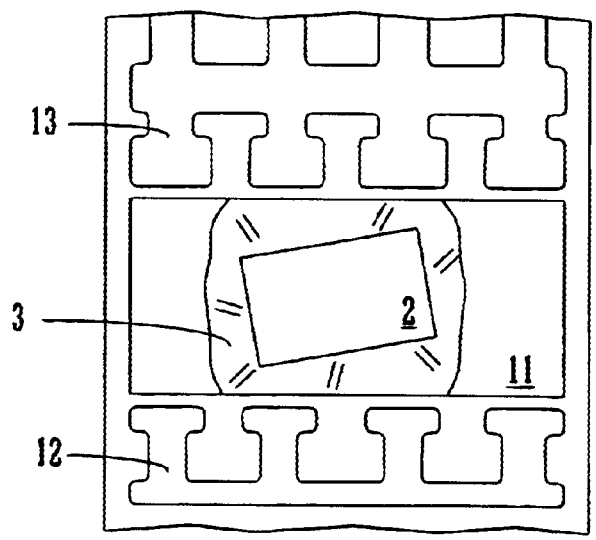
FIG. 2 shows a conventional leadframe having a die thereon.
Figure 3:
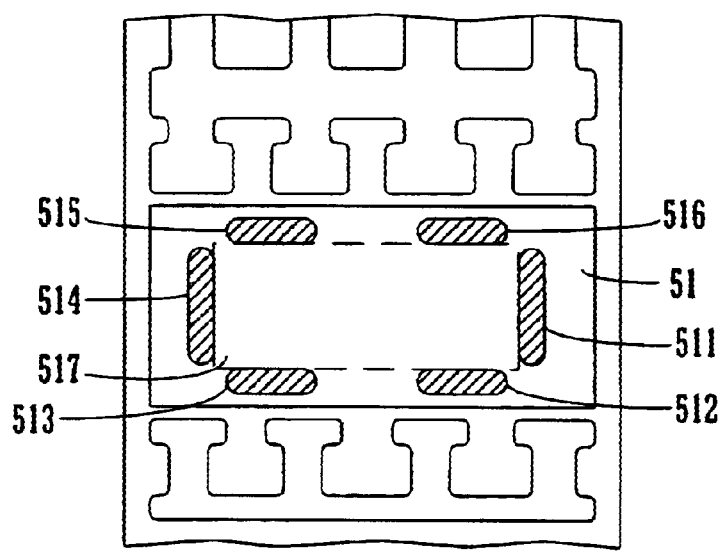
FIG. 3 shows a leadframe according to a first embodiment of the invention.

Referring to FIG. 3, according to the first embodiment of the invention, a die pad 51 of a leadframe 5 has a plurality of slots 511, 512, 513, 514, 515 and 516. The slots 511, 512, 513, 514, 515 and 516 extend through the die pad 51. A restrictive region 517 having a special shape (for example, a rectangle) is defined by the slots 511, 512, 513, 514, 515 and 516, and is indicated with dotted lines in FIG. 3. In other words, the slots 511, 512, 513, 514, 515 and 516 are located at the periphery of the restrictive region 517.

Figure 4:
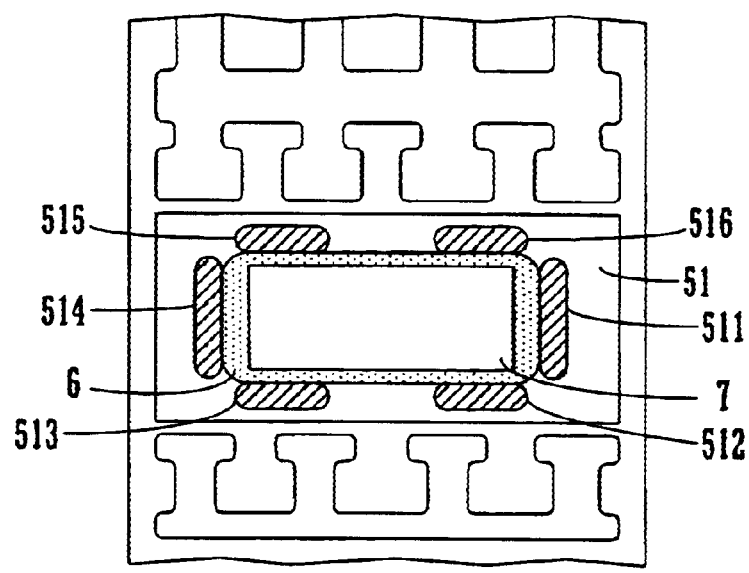
FIG. 4 shows a leadframe having a die thereon according to the first embodiment of the invention.

Referring to FIG. 4, solder paste 6 is placed on the restrictive region 517 of the die pad 51. A die 7 is mounted on the solder paste 6. The die 7 and the die pad 51 are connected by the solder paste 6. The area of the restrictive region 517 is almost equal to the area of the die 7.

Because of the cohesion of the solder paste 6, the solder paste 6 does not flow into the slots 511, 512, 513, 514, 515 and 516. Therefore, the solder paste 6 (tin) does not flow and expand everywhere during the heating process. The solder paste 6 is restricted to the restrictive region 517 so that the die 7 on the solder paste 6 does not drift and is positioned on the restrictive region 517 of the die pad 51 so as to increase the packaging quality.

Figure 5:
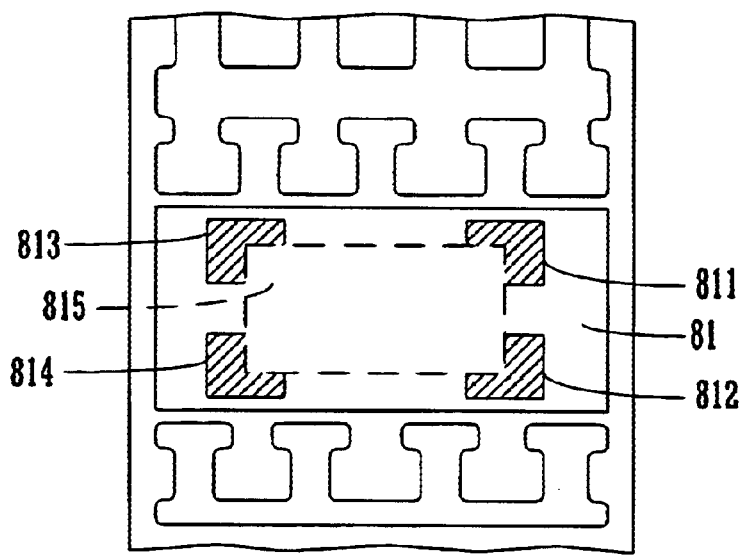
FIG. 5 shows a leadframe according to a second embodiment of the invention.

Referring to FIG. 5, according to the second embodiment of the invention, a die pad 81 of a leadframe 8 has a plurality of slots 811, 812, 813 and 814. The slots 811, 812, 813 and 814 extend through the die pad 81. A rectangular restrictive region 815 is defined by the slots 811, 812, 813 and 814, and is indicated with dotted lines in FIG. 5. The slots 811, 812, 813 and 814 are located at the four corners of the restrictive region 815. Similarly, the slots 811, 812, 813 and 814 can restrict the solder paste to the restrictive region 815.

Figure 6:
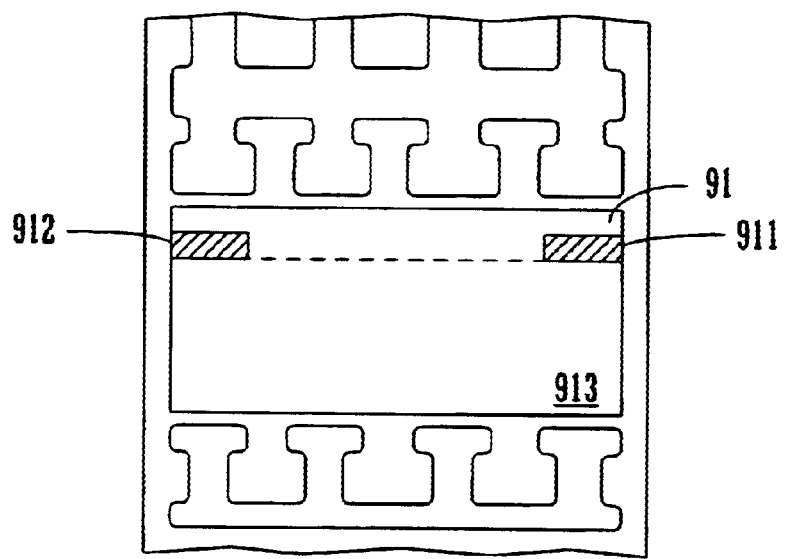
FIG. 6 shows a leadframe according to a third embodiment of the invention.

Referring to FIG. 6, according to the third embodiment of the invention, a die pad 91 of a leadframe 9 has two slots 911 and 912. The slots 911 and 912 extend through the die pad 91. In the third embodiment, the die is larger, and the length of the die is almost equal to that of the die pad 91. The slots 911 and 912 extend in the horizontal direction (of FIG. 6). A rectangular restrictive region 913 is defined by the slots 911, 912 and the periphery of the die pad 91, and is indicated with dotted lines in FIG. 6. That is, the slots 911 and 912 are located at one side of the restrictive region 913. The slots 911 and 912 also can restrict the solder paste to the restrictive region 913.

While embodiments of the present invention have been illustrated and described, various modifications and improvements can be made by those skilled in the art. The embodiments of the present invention are therefore described in an illustrative but not restrictive sense. For example, the present leadframe may have a plurality of die pads, each having a restrictive region which is defined by slots of the above type and where solder paste that connects a die to the die pad is restricted to the restrictive region. It is intended that the present invention not be limited to the particular forms as illustrated, and that modifications not departing from the spirit and scope of the present invention be within the scope as defined in the appended claims.

We claim:

1. A die pad of a leadframe, the die pad having four slots that penetrate the die pad to define a restrictive region having four corners respectively corresponding to the slots such that each slot extends laterally around the corresponding corner outside where the die pad receives a die and such that solder paste for connecting the die to the die pad is substantially restricted to the restrictive region.

2. A die pad as in claim 1 wherein the restrictive region and the die are of approximately identical lateral areas.

3. A leadframe comprising a plurality of die pads and a plurality of pins, each die pad having four slots which penetrate that die pad to define a restrictive region having four corners respectively corresponding to the slots such that each slot extends laterally around the corresponding corner outside where that die pad receives a die and such that solder paste for connecting the die to that die pad is substantially restricted to the restrictive region.

4. A leadframe as in claim 3 wherein each restrictive region and the die connected to that restrictive region are of approximately identical lateral areas.

5. A structure comprising:
   a die;
   a die pad of a leadframe, the die pad having four slots that penetrate the die pad to define a restrictive region having four corners respectively corresponding to the slots, the die connected to the die pad within the restrictive region, each slot extending laterally around the corresponding corner outside where the die pad receives the die; and
   solder paste for connecting the die to the die pad such that the solder paste is restricted to the restrictive region.

6. A structure as in claim 5 wherein the restrictive region and the die are of approximately identical lateral areas.

7. A die pad having:
   a die location for receiving a die, the die location laterally matching the die and having four corners; and
   a plurality of slots that penetrate the die pad to define a restrictive region such that solder paste for connecting the die to the die pad within the restrictive region is substantially restricted to the restrictive region, one of the slots extending around one of the corners of the die location outside the die location.

8. A die pad as in claim 7 wherein another of the slots extends around another of the corners of the die location outside the die location.

9. A leadframe comprising a plurality of die pads and a plurality of pins, each die pad having:
   a die location for receiving a die, the die location laterally matching the die and having four corners; and
   a plurality of slots that penetrate that die pad to define a restrictive region such that solder paste for connecting the die to that die pad within the restrictive region is substantially restricted to the restrictive region, one of the slots extending laterally around one of the corners of the die location outside the die location.

10. A leadframe as in claim 9 wherein another of the slots in each die pad extends around another of the corners of that die pad's die location outside that die pad's die location.

11. A structure comprising:
    a die;
    a die pad having (a) a die location for receiving the die, the die location matching the die and having four corners, and (b) a plurality of slots the penetrate the die pad to define a restrictive region, one of the slots extending laterally around one of the corners of the die location outside the die location; and
    solder paste for connecting the die to the die pad within the restrictive region such that the solder paste is substantially restricted to the restrictive region.

12. A structure as in claim 11 wherein another of the slots extends around another of the corners of the die location outside the die location.

13. A structure as in claim 12 wherein the two corners around which two of the slots respectively extend are adjacent corners of the die location.

14. A structure as in claim 12 wherein the two corners around which two of the slots respectively extend are opposite corners of the die location.

15. A method comprising:
    providing a die pad of a leadframe with four slots that penetrate the die pad to define a restrictive region having four corners respectively corresponding to the slots; and providing solder paste between the restrictive region and a die for connecting the die to the die pad such that each slot extends laterally around the corresponding corner outside where the die pad receives the die and such that the solder paste is substantially restricted to the restrictive region.

16. A method as in claim 15 wherein the restrictive region and the die are of approximately identical lateral areas.

17. A method comprising:
    providing a die pad with a plurality of slots that penetrate the die pad to define a restrictive region; and
    providing solder paste between the restrictive region and a die for connecting the die to the die pad at a die location within the restrictive region such that the die location laterally matches the die and has four corners, such that one of the slots extends laterally around one of the corners of the die location outside the die location, and such that the solder paste is substantially restricted to the restrictive region.

18. A method as in claim 17 wherein another of the slots extends around another of the corners of the die location outside the die location.

19. A method as in claim 18 wherein the two corners around which two of the slots respectively extend are adjacent corners of the die location.

20. A method as in claim 18 wherein the two corners around which two of the slots respectively extend are opposite corners of the die location.

* * * * *